(12) United States Patent
Kwon et al.

(10) Patent No.: US 10,454,004 B2
(45) Date of Patent: Oct. 22, 2019

(54) LIGHT SOURCE MODULE, BACKLIGHT UNIT AND LIQUID CRYSTAL DISPLAY DEVICE INCLUDING THE SAME

(71) Applicant: LG Display Co., Ltd., Seoul (KR)

(72) Inventors: KyuOh Kwon, Daejeon (KR); Junghun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/847,276

(22) Filed: Dec. 19, 2017

(65) Prior Publication Data

US 2018/0182935 A1 Jun. 28, 2018

(30) Foreign Application Priority Data

Dec. 23, 2016 (KR) .................. 10-2016-0177888

(51) Int. Cl.
| | |
|---|---|
| F21V 7/04 | (2006.01) |
| H01L 33/54 | (2010.01) |
| F21V 8/00 | (2006.01) |
| G02F 1/1335 | (2006.01) |
| H01L 33/20 | (2010.01) |
| H01L 33/50 | (2010.01) |
| H01L 33/64 | (2010.01) |
| H01L 25/075 | (2006.01) |

(52) U.S. Cl.
CPC ............ *H01L 33/54* (2013.01); *G02B 6/0055* (2013.01); *G02B 6/0073* (2013.01); *G02B 6/0083* (2013.01); *G02F 1/133603* (2013.01); *H01L 33/20* (2013.01); *H01L 33/507* (2013.01); *H01L 33/641* (2013.01); *G02F 1/133605* (2013.01); *G02F 2001/133607* (2013.01); *H01L 25/0753* (2013.01)

(58) Field of Classification Search
CPC ............... G02B 6/0068; G02B 6/0021; G02F 1/133603
USPC ......................................................... 362/612
See application file for complete search history.

(56) References Cited

U.S. PATENT DOCUMENTS

| | | | |
|---|---|---|---|
| 2006/0098434 | A1 | 5/2006 | Liu et al. |
| 2011/0315999 | A1 | 12/2011 | Sharma et al. |
| 2012/0206660 | A1 | 8/2012 | Kasai |
| 2014/0104885 | A1* | 4/2014 | Zhang ............... G02B 6/0036 362/626 |
| 2015/0357522 | A1 | 12/2015 | Yamada et al. |
| 2016/0266299 | A1* | 9/2016 | Yoon ....................... G02B 6/00 |
| 2017/0254945 | A1* | 9/2017 | You ....................... G02B 6/0031 |
| 2017/0299796 | A1* | 10/2017 | Kim ....................... G02B 6/0053 |

FOREIGN PATENT DOCUMENTS

| | | |
|---|---|---|
| JP | H10326910 A | 12/1998 |
| KR | 10-2006-0046432 A | 5/2006 |
| KR | 20110032491 A | 3/2011 |

* cited by examiner

*Primary Examiner* — Ahshik Kim
(74) *Attorney, Agent, or Firm* — Polsinelli PC

(57) ABSTRACT

A light source module having high efficiency and high heat dissipation characteristics and a backlight unit and a liquid crystal display device including the same are disclosed. The light source module comprises light sources packaged in a printed circuit board, and an encapsulation film surrounding the light sources, wherein the light sources have a triangular prism shape.

20 Claims, 9 Drawing Sheets

LIGHT SOURCE MODULE, BACKLIGHT UNIT AND LIQUID CRYSTAL DISPLAY DEVICE INCLUDING THE SAME

CROSS REFERENCE TO RELATED APPLICATION

This application claims the benefit of the Korean Patent Application No. 10-2016-0177888 filed on Dec. 23, 2016, which is hereby incorporated by reference in its entirety for all purposes as if fully set forth herein.

BACKGROUND

Field of the Disclosure

The present disclosure relates to a display device, and more particularly, to a light source module, a backlight unit and a liquid crystal display device including the same.

Description of the Background

An active matrix type liquid crystal display device is a switching device, and displays a moving image by using a thin film transistor. Since this liquid crystal display device enables small scale as compared with a cathode ray tube (CRT), the liquid crystal display device has been applied to display devices such as a portable information device, business machines, computers, etc. and also applied to a TV, thereby the liquid crystal display device has rapidly substituted for the CRT. Since the liquid crystal display device is not a self-light emitting device, the liquid crystal display device requires a backlight unit arranged under a liquid crystal panel to display an image by using light emitted from the backlight unit.

The backlight unit is categorized into a direct type and an edge type depending on an arrangement structure of light sources. The edge type has a structure that light sources are arranged at one side of a light guide plate, and the direct type has a structure that light sources are arranged below a liquid crystal panel. In this case, since the direct type has a limitation in a thin size, the direct type is mainly used for a liquid crystal display device in which brightness is more important than a thickness of a screen. The edge type that may be lighter and thinner than the direct type is mainly used for a liquid crystal display device, such as a notebook PC or monitor, in which a thickness is more important.

The backlight unit includes light sources, and light emitting diodes (LEDs) have been used instead of a cold cathode fluorescent lamp (CCFL) in accordance with the development of the technology. The light emitting diodes are widely used as light sources of the liquid crystal display device owing to their advantages such as longer lifespan, faster response characteristic, less power consumption and smaller scale than the existing fluorescent lamp.

However, the light emitting diode has a drawback in that efficiency and lifespan are reduced as a temperature is increased. Therefore, studies and developments for increasing emission efficiency and heat dissipation characteristics of the light sources have been made.

SUMMARY

Accordingly, the present disclosure is directed to a light source module, a backlight unit and a liquid crystal display device including the same, which substantially obviate one or more problems due to limitations and disadvantages of the related art.

An advantage of the present disclosure is to provide a light source module having high efficiency and high heat dissipation characteristics, a backlight unit and a liquid crystal display device including the same.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, the present disclosure provides a light source module comprising light sources packaged in a printed circuit board and an encapsulation film surrounding the light sources, the light sources having a triangular prism shape, and a backlight unit and liquid crystal display device including the same.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a light source module and a backlight unit including the same and a liquid crystal display device according to various aspects of the present disclosure will be described in detail with reference to the accompanying drawings. Wherever possible, the same reference numbers will be used throughout the drawings to refer to the same or like parts. Also, in the following description of the present disclosure, if detailed description of elements or functions known in respect of the present disclosure is determined to make the subject matter of the present disclosure unnecessarily obscure, the detailed description will be omitted.

Hereinafter, various aspects of the present disclosure will be described in detail with reference to the accompanying drawings.

Figure 1:
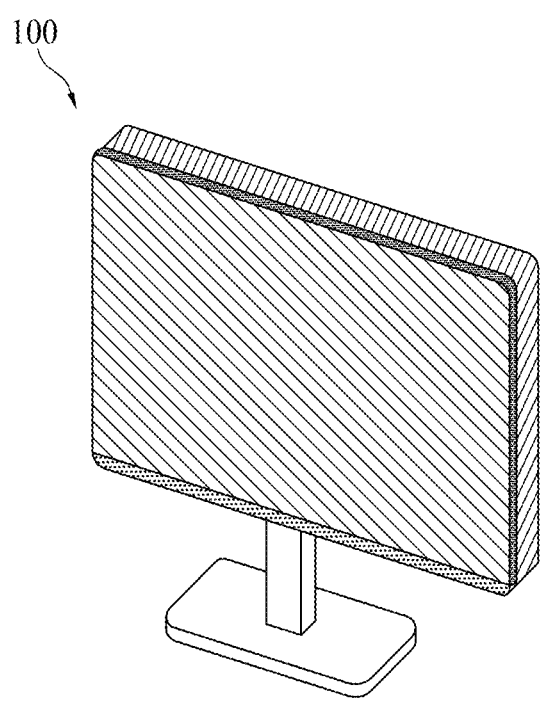
FIG. 1 is a perspective view illustrating a liquid crystal display device according to one aspect of the present disclosure.
Figure 2:
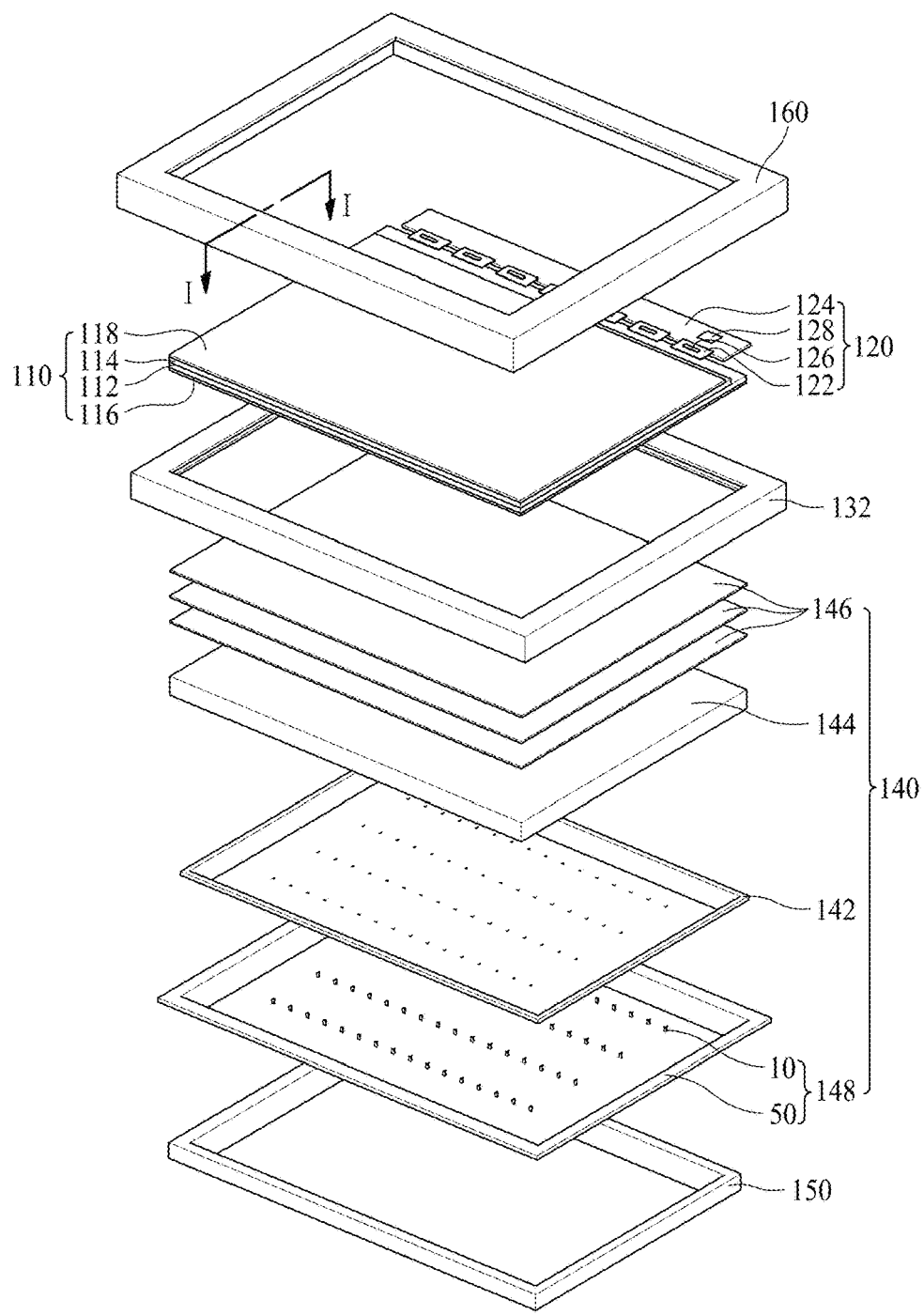
FIG. 2 is an exploded perspective view specifically illustrating a liquid crystal display device according to an aspect of the present disclosure.
Figure 3:
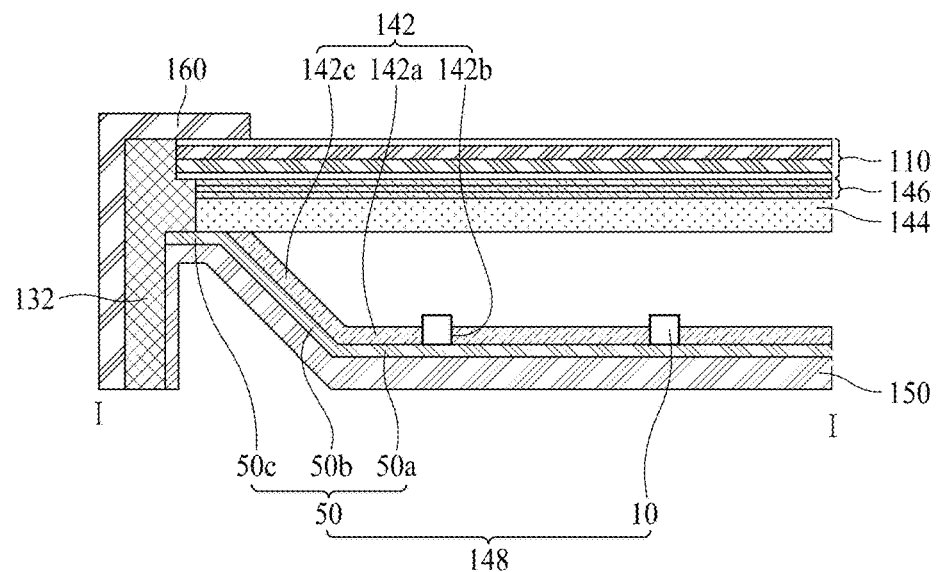
FIG. 3 is a cross-sectional view taken along line I-I' of FIG. 2, illustrating a liquid crystal display device according to an aspect of the present disclosure.

FIG. 1 is a perspective view illustrating a liquid crystal display device according to an aspect of the present disclosure, FIG. 2 is an exploded perspective view specifically illustrating a liquid crystal display device according to an aspect of the present disclosure, and FIG. 3 is a cross-sectional view taken along line I-I' of FIG. 2, illustrating a liquid crystal display device according to an aspect of the present disclosure.

Referring to FIGS. 1 to 3, the liquid crystal display device 100 according to one aspect of the present disclosure has a direct type structure in which light sources 10 are arranged under a liquid crystal panel 110, and comprises the liquid crystal panel 110, a panel driver 120, a guide frame 132, a backlight unit 140, a lower case 150, and an upper case 160.

The liquid crystal panel 110 displays a predetermined image by using light irradiated from the backlight unit 140. The liquid crystal panel 110 displays an image by controlling light transmittance of a liquid crystal layer, and includes a lower substrate 112 and an upper substrate 114 bonded to each other by interposing a liquid crystal layer (not shown) therebetween, a lower polarizing member 116 attached to the lower substrate 112, and an upper polarizing member 118 attached to the upper substrate 114, and a side sealing member (not shown) attached to a side of the upper substrate 114. The liquid crystal panel 110 displays a predetermined color image in accordance with light transmittance of the liquid crystal layer by driving the liquid crystal layer in accordance with an electric field formed per pixel by data and common voltages applied to each pixel.

The lower substrate 112 is a thin film transistor array substrate, and includes a plurality of pixels (not shown) arranged per area where a plurality of gate lines (not shown) cross a plurality of data lines (not shown). Each pixel may include a thin film transistor (not shown) connected to the gate and data lines, a pixel electrode connected to the thin film transistor, and a common electrode arranged to adjoin the pixel electrode and supplied with a common voltage. At this time, the common electrode may be arranged on the upper substrate 114 in accordance with a driving mode of the liquid crystal layer. The lower substrate 112 displays a predetermined color image on the liquid crystal panel 110 by forming an electric field corresponding to a differential voltage between a data voltage and a common voltage, which are applied to each pixel, and controlling light transmittance of colored light transmitting the upper substrate 114 and the liquid crystal layer.

A pad portion (not shown) to which various signals for driving each pixel are supplied is provided at a lower side or upper side of the upper substrate 112. At this time, the panel driver 120 for driving the liquid crystal panel 110 is connected to the pad portion.

The upper substrate 114 is a color filter array substrate, and is formed to have an area relatively smaller than that of the lower substrate 112. The upper substrate 114 is bonded to the lower substrate 112 by interposing the liquid crystal layer therebetween, thereby the upper substrate 114 is overlapped with the other area except the pad portion of the lower substrate 112. At this time, the upper substrate 114 may include a horizontal and vertical light-shielding layer (not shown) for defining a pixel area corresponding to each pixel formed on the lower substrate 112, an edge light-shielding layer (not shown) formed at an edge portion of the upper substrate 114, and a color filter (not shown) formed per pixel area. The color filter filters light incident through the lower substrate 112 from the back light unit 140 and entering the upper substrate 114 as predetermined color light. A common electrode (not shown) to which a common voltage is supplied may be arranged on the upper substrate 114 in accordance with a driving mode of the liquid crystal layer.

Meanwhile, the detailed elements of the upper substrate 112 and the lower substrate 114 may be formed in various shapes known in the art in accordance with the driving mode of the liquid crystal layer, for example, a TN (Twisted Nematic) mode, a VA (Vertical Alignment) mode, an IPS (In plane switching) mode, and an FFS (Fringe field switching) mode.

The lower polarizing member 116 is attached to a rear surface of the lower substrate 112, and is arranged except an end of the lower substrate 112. The lower polarizing member 116 polarizes light incident from the back light unit 140.

The upper polarizing member 118 is attached to an upper surface of the upper substrate 114, and polarizes color light emitted to the outside by transmitting the upper substrate 114.

The side sealing member (not shown) may be arranged to cover sides of the lower substrate 112 and the upper substrates 114 to protect light leakage and the sides of the lower substrate 112 and the upper substrate 114. The side sealing member (not shown) may be made of a thermal hardening resin or optical hardening resin.

The panel driver 120 is connected to the pad portion provided on the lower substrate and displays a predetermined color image on the liquid crystal panel 110 by driving each pixel of the liquid crystal panel 110. The panel driver 120 according to an aspect includes a plurality of circuit films 122 connected to the pad portion of the liquid crystal panel 110, a data driving integrated circuit 126 packaged in each of a plurality of circuit films 122, a display printed circuit board 124 coupled to each of the plurality of circuit films 122, and a timing controller 128 packaged in the display printed circuit board 124.

Each of the circuit films 122 is attached between the pad portion of the lower substrate and the display printed circuit board 124 by a film attachment process, and may be made of a tape carrier package (TCP) or a chip on flexible board or chip on film (COF). Each of the circuit films 122 is bent along one side of the liquid crystal panel 110, that is, a lower side, and is arranged on a rear surface of the guide frame 132.

The data driving integrated circuit 126 is packaged in each of the plurality of circuit films 122 and thus connected to the pad portion through the circuit films 122. The data driving integrated circuit 126 receives a data control signal and per-pixel data supplied from the timing controller 128, converts the per-pixel data to an analog type data signal in accordance with the data control signal, and supplies the converted data signal to a corresponding data line through the pad portion.

The display printed circuit board 124 is connected with the plurality of circuit films 122. The display printed circuit board 124 serves to supply a signal required to display an image on each pixel of the liquid crystal panel 110 to the data driving integrated circuit 126 and a gate driving circuit. To this end, various signal lines, various power circuits (not shown), and a memory device (not shown) are packaged in the display printed circuit board 124.

The timing controller 128 generates per-pixel data by aligning digital image data, which are input from a driving system in response to a timing synchronization signal packaged in the display printed circuit board 124 and supplied from an external driving system (not shown), to be suitable for a pixel arrangement structure of the liquid crystal panel 110, and provides the generated per-pixel data to the data driving integrated circuit 126. Also, the timing controller 128 controls a driving timing of each of the data driving integrated circuit 126 and the gate driving circuit by generating each of a data control signal and a gate control signal on the basis of the timing synchronization signal.

Additionally, the timing controller 128 may individually control luminance per area of the liquid crystal panel 110 by controlling the backlight unit 140 through an edge type local dimming technique.

The guide frame 132 is arranged in the form of frame surrounding the sides of the backlight unit 140 and the liquid crystal display device 100. The guide frame 132 supports an edge portion of the liquid crystal panel 110.

The backlight unit 140 is arranged below the liquid crystal panel 110 and irradiates light to a lower surface of the liquid crystal panel 110. Therefore, the backlight unit 140 is received in a lower case 150. The backlight unit 140 according to an aspect may include a reflective member 142, a diffusion plate 144, an optical sheet portion 146, and a light source module 148.

The reflective member 142 is arranged on the printed circuit board 50 of the light source module 148 which will be described later. The reflective member 142 is arranged below the diffusion plate 144 and reflects light incident from the light sources 10 of the light source module 148 toward the diffusion plate 144, thereby minimizing loss of light. The reflective member 142 is made of a reflective material. The reflective member 142 according to an aspect includes a lower surface member 142a and a side member 142c.

The lower surface member 142a is arranged on a bottom 50a of the printed circuit board, which will be described later. The lower surface member 142a reflects light, which is headed for a downward direction from the light sources 10, toward the diffusion plate 144. At this time, a plurality of light source insertion holes 142b are provided on the lower surface member 142a of the reflective member 142. The light sources 10 packaged in the printed circuit board 50 through the plurality of light source insertion holes 142b may be arranged on the reflective member 142.

The side member 142c is extended from the lower surface member 142a and then arranged on an inclined surface 50b of the printed circuit board 50, which will be described later. The side member 142c reflects light, which is headed for a side direction from the light sources 10, toward the diffusion plate 144. At this time, the side member 142c may be extended to a support surface 50c of the printed circuit board 50 and then arranged.

Meanwhile, a diffusion plate support member (not shown) may be arranged among the light sources 10, and may be omitted. The diffusion plate support member is arranged between the reflective member 142 and the diffusion plate 144 and serves to support the diffusion plate 144. An edge of the diffusion plate 144 is supported by the lower case 150, but if the backlight unit 140 and the liquid crystal display device 100 have a large scaled size, a center of the diffusion plate 144 may be sagged by load. Therefore, the diffusion plate support member is arranged on the reflective member 142 at the same height as that between the reflective member 142 and the diffusion plate 144 to support the diffusion plate 144.

The diffusion plate 144 is formed in the form of a flat panel having a certain thickness and arranged to cover a receiving space of the lower case 150. The diffusion plate 144 serves to diffuse light emitted from each of the plurality of light sources 10 to forward to the liquid crystal panel 110. The diffusion plate 144 is arranged to be spaced apart from the light sources 10 as much as an optical gap. The diffusion plate 144 may be supported by the lower case 150 and fixed by the guide frame 132.

The optical sheet portion 146 is arranged on the diffusion plate 144. The optical sheet portion 146 serves to forward to the liquid crystal panel 110 by condensing and diffusing light to increase luminance of the liquid crystal panel 110. The optical sheet portion 146 according to one aspect may be any one of a prism sheet, a lenticular sheet and a micro lens sheet.

The prism sheet may include a plurality of prism patterns formed in parallel to have a triangular section, wherein a mountain portion and a valley portion of the prism pattern may be rounded at a certain curvature.

The lenticular lens sheet may include a plurality of lenticular lens patterns formed in parallel to have a semicircle or semi-elliptical shaped section having a certain curvature.

The micro lens sheet may include a plurality of micro lens patterns formed at a certain height to have a semicircle or semi-elliptical shape.

Meanwhile, the optical sheet portion 146 may further include a protective sheet for protecting the optical sheet.

The light source module 148 is arranged to face a lower surface of the diffusion plate 144 and irradiates light to the diffusion plate 144. The light source module 148 according to an aspect includes the light sources 10 packaged in the printed circuit board 50 therefor, emitting light through a driving signal of a light source portion supplied from a backlight driver (not shown).

The printed circuit board 50 is arranged on the lower case 150. The printed circuit board 50 packages the plurality of light sources 10 therein. The printed circuit board 50 according to one aspect includes a bottom surface 50a, an inclined surface 50b, and a support surface 50c.

The bottom surface 50a is arranged to face the liquid crystal panel 110. The bottom surface 50a packages the light sources 10 thereon, so that the light sources 10 may irradiate light while facing the liquid crystal panel 110.

The inclined surface 50b is extended from the bottom surface 50a to constitute a side of the printed circuit board 50. The inclined surface 50b may be inclined obliquely to allow light emitted from the light sources 10 arranged on the bottom surface 50a to be reflected toward the diffusion plate 144.

The support surface 50c is arranged at an edge of the printed circuit board 50. The support surface 50c is extended from the support surface 50b to face the liquid crystal panel 110. The support surface 50c may support the diffusion plate 144.

The respective light sources 10 are arranged in parallel to be spaced apart from each other on the printed circuit board 50 for light sources and then connected to a light source driving signal line. The plurality of light sources 10 irradiates light to the lower surface of the diffusion plate 144. Each of the plurality of light sources 10 may emit light simultaneously or individually in accordance with a light source driving signal supplied from the light source driving signal line. Each of the plurality of light sources 10 may emit light individually in accordance with a local dimming method for partially controlling luminance. The light sources 10 of the liquid crystal display device 100 according to one aspect of the present disclosure have a triangular prism shape. The light sources 10 according to one aspect of the present disclosure, which have a triangular prism shape, generate total reflection less than those of the related art, which have a rectangular prism shape, thereby power consumption and lifespan may be improved.

A detailed description of the light source module 148 will be described in detail with reference to FIGS. 4 to 8.

The lower case 150 receives the backlight unit 140 in a receiving space and also supports the guide frame 132. The lower case 150 may be made of a metal material to dissipate the heat generated from the light sources 10.

The upper case 160 is arranged in the form of a frame surrounding the backlight unit 140 and the liquid crystal display device 100. The upper case 160 is coupled to the guide frame 132 and fixes the liquid crystal panel 110 supported by the guide frame 132. At this time, the upper case 160 may be coupled to the lower case 150 in accordance with a coupling method based on a coupling member such as a screw or a hook. Therefore, the upper case 160 prevents a front edge portion of the liquid crystal panel 110 and the guide frame 132 from being exposed to the outside of the liquid crystal display device 100.

Figure 4:
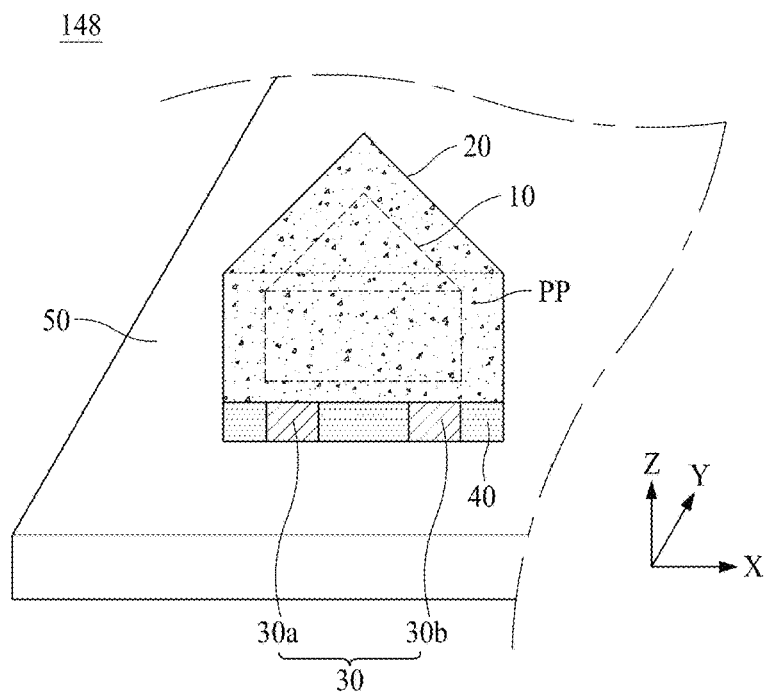
FIG. 4 is a perspective view illustrating a light source module according to an aspect of the present disclosure.

FIG. 4 is a perspective view illustrating a light source module according to an aspect of the present disclosure.

Referring to FIG. 4, the light source module 148 according to an aspect of the present disclosure includes a printed circuit board 50, light sources 10, an encapsulation film 20, a pad portion 30 having a first pad portion 30a and a second pad portion 30b, and an under fill 40.

The printed circuit board 50 packages the light sources 10 therein. The printed circuit board 50 includes a driving power line to which an external driving power is supplied, and allows the plurality of light sources 10 to emit light by supplying the externally supplied driving power to each of the plurality of light sources 10 through the driving power line.

The light sources 10 are made of a chip-scale package and directly packaged in the printed circuit board 50. Therefore, in the present disclosure, a packaging process of the light sources 10 is not required. The light sources 10 according to one aspect of the present disclosure emit first colored light in accordance with a light source driving signal. For example, the light sources 10 may be blue light sources 10 for emitting blue light. Also, a lateral chip structure, a flip chip structure, a vertical chip structure or like may be applied to the light sources 10.

The light sources 10 according to an aspect of the present disclosure have a triangular prism shape. The light sources 10 according to an aspect of the present disclosure may have a base side of a triangular shape with two apexes of the same angle. As the apex angle except for two base angles having the same angle on the base side of the light sources 10 according to an aspect of the present disclosure may be greater or smaller than the base angle, light efficiency is improved. If the apex angle becomes greater, a x-axis beam angle becomes narrow and y-axis beam angle becomes wide.

As the light sources 10 according to an aspect of the present disclosure have a triangular prism shape, total reflection is less generated than those of the related art, which have a rectangular prism shape, thereby light efficiency is increased. Also, power consumption and lifespan of the light source module 148 and the backlight unit 140 including the same and the liquid crystal display device 100 may be improved.

The encapsulation film 20 surrounds the light sources 10. The encapsulation film 20 according to an aspect surrounds the light sources 10, and may have a shape such as a rectangular prism, a polygonal prism, a cylinder, and semi sphere. However, when the encapsulation film 20 according to an aspect of the present disclosure has the same shape as that of the light sources 10 according to the present disclosure, emission efficiency of light which is emitted and luminous flux may be most increased. In more detail, the encapsulation film 20 has an upper surface of a triangular shape and a side of a triangular prism shape, and surrounds the upper surface and the side of the light sources 10 in the same shape. Also, when the center of the light sources 10 according to an aspect of the present disclosure is concurrently located at that the center of the encapsulation film 20, a total reflection of light emitted from the light sources 10 and the encapsulation film 20 can be reduced, thereby emission efficiency and luminous flux can be most increased.

When it is supposed that a luminous flux of the light source module 148 of the related art, in which the light sources 10 of a rectangular prism shape are surrounded with the encapsulation film of a rectangular prism shape, is 100%, a luminous flux of the light source module 148, in which the light sources 10 of a triangular prism shape are surrounded with the encapsulation film 20 of which upper surface has a circle shape, is increased to 102.1%, and a luminous flux of the light source module 148, in which the light sources 10 of a triangular prism shape are surrounded with the encapsulation film 20 of which upper surface has a rectangular shape, is increased to 102.3%. A luminous flux of the light source module 148 according to one aspect of the present disclosure, in which the light sources 10 of a triangular prism shape are surrounded with the encapsulation film 20 of which upper surface has a triangular shape, is most increased to 103.1%. Also, the light source module 148 according to one aspect of the present disclosure includes light sources 10 of which y-axis beam angle is 140°, whereas a y-axis beam angle of the light source module 148 according to one aspect of the present disclosure is increased to 155°.

As the encapsulation film 20 according to an aspect of the present disclosure has an upper surface of a triangular shape, total reflection is less generated than that of the related art, which has a rectangular shape, thereby light efficiency is increased. Also, power consumption and lifespan of the light source module 148 and the backlight unit 140 including the same and the liquid crystal display device 100 may be improved.

Paths from which the light source module 148 of the related art and the light source module 148 of the present disclosure emit light will be described in detail with reference to FIGS. 4, 5A and 5B, respectively.

The encapsulation film 20 may be made of a mixture material of an encapsulation material and a phosphor PP. The encapsulation material is a material surrounding the light sources 10 including the phosphor PP, and may be silicon, for example.

The phosphor PP may be a plurality of phosphor materials displaying at least one color included in the encapsulation film 20. The phosphor PP may be a yellow phosphor material, but may be one or more color phosphor materials for generating white light in accordance with color light emitted from the light sources 10 without limitation to the yellow phosphor material. The phosphor PP according to an aspect may emit yellow light by partially absorbing blue light emitted from the light sources 10. White light may be generated in the encapsulation film 20 according to one aspect by mixture of blue light emitted from the light sources 10 and yellow light emitted from the phosphor PP, and then may be emitted to the outside.

The pad portion 30 is provided below the light sources 10. The pad portion 30 is arranged below the light sources 10 and on the printed circuit board 50, and supplies a current to the light sources 10. The pad portion 30 is made of a material having high electrical conductivity, for example, metal. The pad portion 30 includes a first pad portion 30a and a second pad portion 30b, wherein the first pad portion 30a may be a positive (+) electrode, and the second pad portion 30b may be a negative (−) electrode. When the pad portion 30 is arranged on the printed circuit board 50, the pad portion 30 is fixed by a bonding material, which may be a material of solder, rosin and resin, which is comprised of $Sn_{0.9605}/Ag_{0.03}/Cu_{0.005}$ and mixed with flux.

The under fill 40 is provided under the light sources 10. In more detail, the under fill 40 may be arranged between the light sources 10 and the printed circuit board 50 and between the first pad portion 30a and the second pad portion 30b. When the light sources 10 are packaged in the printed circuit board 50 in a state of flexibility, the under fill 40 is filled between the light sources 10 and the pad portion 30 below the light sources 10 by being pushed by the pad portion 30. Then, if the under fill 40 is hardened by heat or UV hardening, the under fill 40 may serve to fix the light sources 10 and buffer external impact, and may prevent a crack from being generated.

The under fill 40 according to an aspect of the present disclosure is made of a material having low electrical conductivity (below $10^{-6} \sim 10^{-8}$ S/cm) and high heat conductivity (more than 8~12 W/mK). For example, the under fill 40 may be made of h-BN or $Al_2O_3$. Since the under fill 40 according to an aspect of the present disclosure is made of a material having no electrical conductivity or low electrical conductivity, the under fill 40 is not electrically connected with the pad portion 30, a defect does not occurs. Also, since the under fill 40 according to an aspect of the present disclosure is made of a material having high heat conductivity, heat generated from the light sources 10 moves to the under fill 40 without staying in the light sources 10, thereby heat dissipation characteristic of the light sources 10 is improved, and a temperature of the light sources 10 is lowered to prevent efficiency and lifespan of the light sources 10 from being lowered.

Also, the under fill 40 according to an aspect of the present disclosure is made of a material having high reflectivity. For example, the under fill 40 may be white silicon including resin and $TiO_2$. At this time, reflectivity of the under fill 40 is 90% or more. Since the under fill 40 according to an aspect of the present disclosure is made of a material having high reflectivity, the under fill 40 upwardly reflects light emitted from the light sources 10 to a downward direction, thereby emission efficiency and luminance of the light source module 148 may be increased.

Since the light source module 148 according to an aspect of the present disclosure includes the light sources 10 and the encapsulation film 20 of a triangular prism shape, a total reflection may be reduced, thereby emission efficiency may be increased and power consumption and lifespan of the backlight unit 140 including the light source module 148 and the liquid crystal display device 100 may be improved. Also, as the under fill 40 having low electrical conductivity, excellent heat conductivity and high reflectivity is provided under the light sources 10, the light source module 148 according to an aspect of the present disclosure has high efficiency and high heat dissipation characteristics.

Figure 5A:
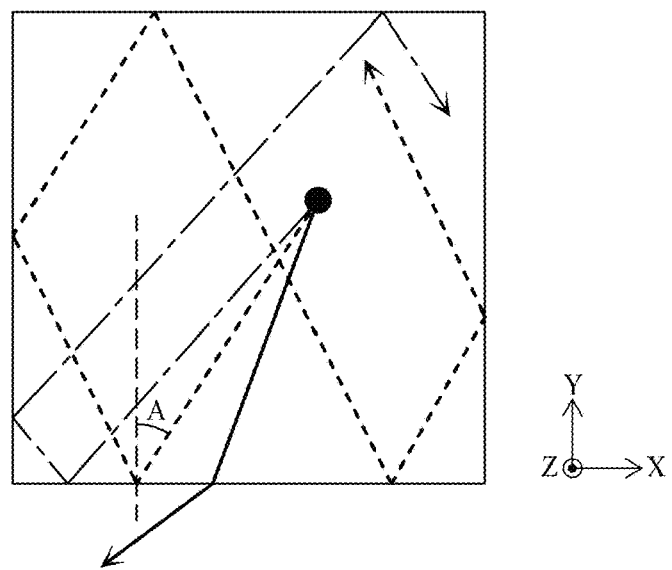
FIGS. 5A and 5B are plan views respectively illustrating paths from which the related art light source module and a light source module according to the present disclosure emit light.
Figure 5B:
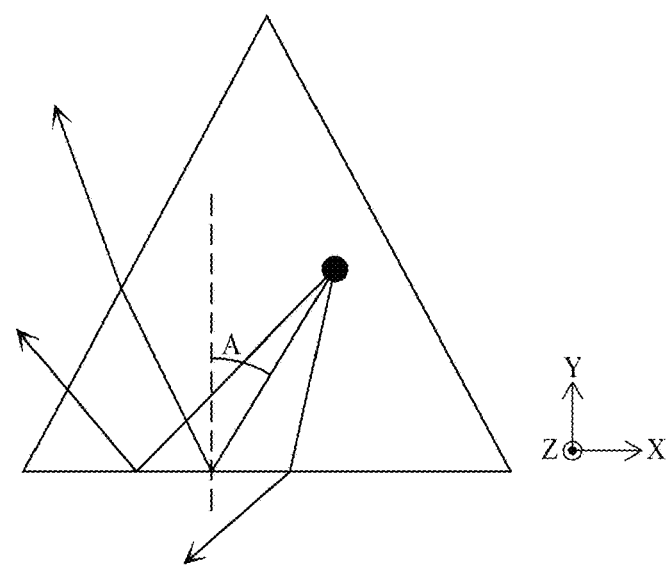

FIGS. 5A and 5B are plan views respectively illustrating paths from which the related art light source module and a light source module according to the present disclosure emit light.

FIG. 5A illustrates a path of light which is emitted when the light sources 10 and the encapsulation film 20 have a rectangular shaped upper surface in the light source module 148 according to the related art. Referring to FIG. 5A, light emitted from any one point is reflected whenever the light is in contact with the rectangular side. The light is not emitted due to a total reflection and continues to be reflected within the light sources 10 when an incident light A is between 41° and 49°. In this way, the light totally reflected three times or more among the light emitted from the light sources 10 is lost due to total reflection, and deteriorates emission efficiency and luminance of the light sources 10.

FIG. 5B illustrates a path of light which is emitted when the light sources 10 and the encapsulation film 20 have a triangular shaped upper surface in the light source module 148 according to the present disclosure. Referring to FIG. 5B, light emitted from any one point is reflected whenever the light is in contact with the triangular side. The emitted light is totally reflected when an incident light A is between 41° and 49°, but the light is emitted to the outside of the light sources 10 when it is reflected secondarily. In this way, in the light source module 148 according to one aspect of the present disclosure, as the light sources 10 have a triangular prism shape and the encapsulation film 20 has a shape surrounding the side and the upper surface of the light sources 10 in the same shape, total reflection of the light emitted from the light sources 10 is reduced to reduce light loss, thereby the light source module 148 having improved emission efficiency and luminance and the backlight unit 140 including the same and the liquid crystal display device 100 may be implemented.

Figure 6A:
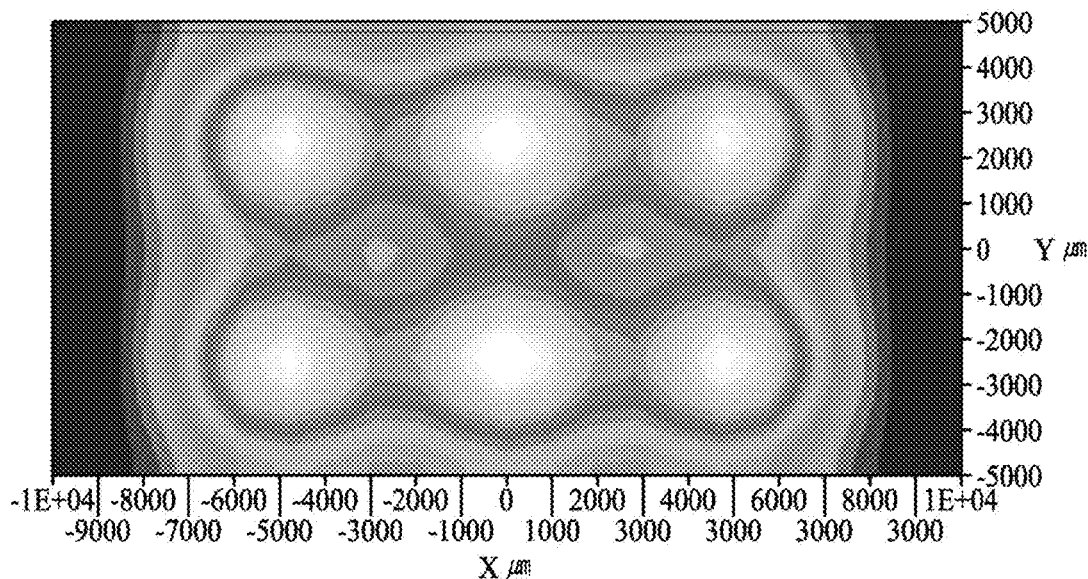
FIGS. 6A and 6B respectively illustrate luminance of the related art light source module and luminance of a light source module according to an aspect of the present disclosure.
Figure 6B:
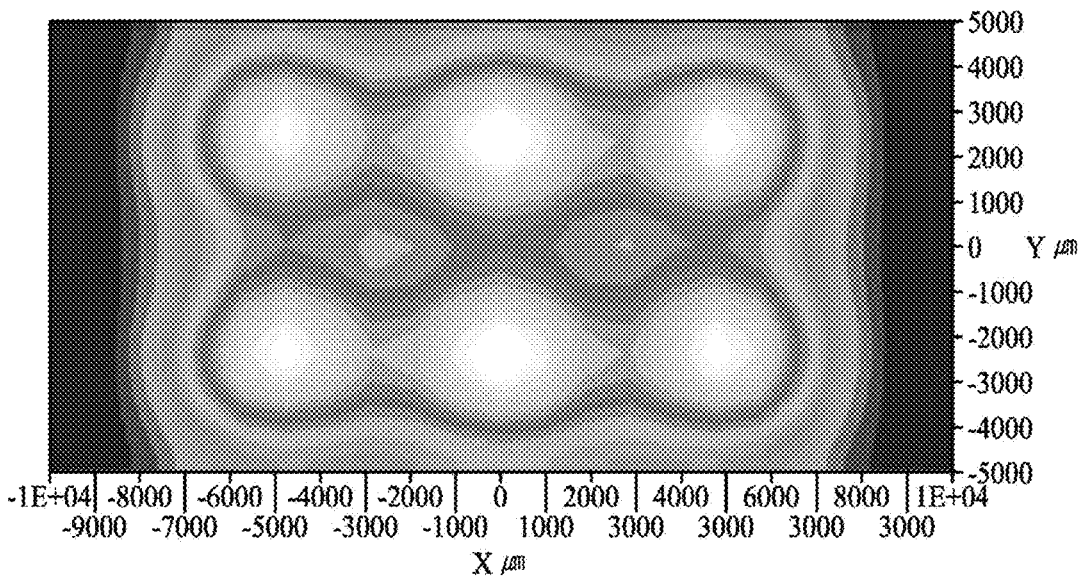

FIGS. 6A and 6B illustrate luminance of the related art light source module and luminance of a light source module according to an aspect of the present disclosure.

FIG. 6A illustrates luminance when the light sources 10 and the encapsulation film 20 have a rectangular shaped upper surface in the light source module 148 according to the related art. It is generally noted that high luminance can be achieved with bright color. FIG. 6B illustrates luminance when the light sources 10 and the encapsulation film 20 have a triangular shaped upper surface in the light source module 148 according to the present disclosure. Referring to FIGS. 6A and 6B, luminance of the light source module 148 according to the present disclosure shown in FIG. 6B is higher than that of the light source module 148 according to the related art shown in FIG. 6A. Also, when luminance of the light source module 148 according to the related art shown in FIG. 6A is 100%, luminance of the light source module 148 according to the present disclosure shown in FIG. 6B is 105.3% improved as much as 5.3%.

The light source module 148 according to an aspect of the present disclosure has improved luminance and light incident efficiency as compared with the light source module 148 according to the related art, thereby quality of external appearance of the light source module may be improved.

Figure 7:
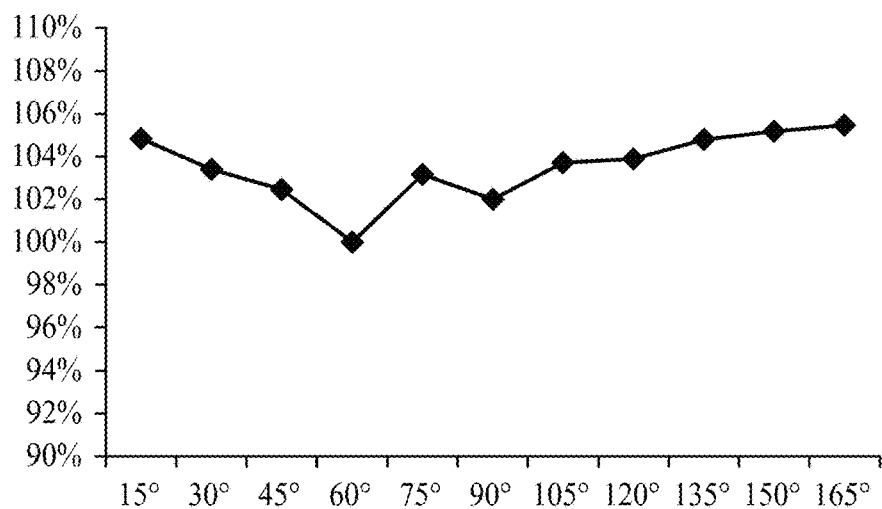
FIG. 7 is a graph illustrating a change in a luminous flux per apex angle of a light source module according to an aspect of the present disclosure.
Figure 8:
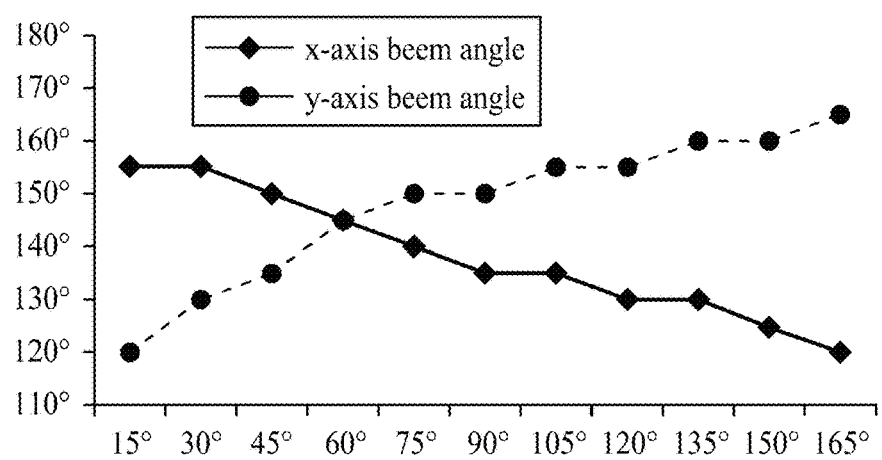
FIG. 8 is a graph illustrating a beam angle per apex angle of a light source module according to an aspect of the present disclosure.

FIG. 7 is a graph illustrating a change in a luminous flux per apex angle of a light source module according to an aspect of the present disclosure, and FIG. 8 is a graph illustrating a beam angle per apex angle of a light source module according to an aspect of the present disclosure.

A base side of the light sources 10 according to an aspect of the present disclosure has a triangular shape with two apexes of the same angle. At this time, a horizontal axis of FIG. 7 illustrates an angle of an apex angle except for two base angles of the same angle on the base side of the light sources 10 having a triangular shape, and a vertical axis of FIG. 7 illustrates a change in a luminous flux per apex angle. Referring to FIG. 7, the apex angle is 60°, and the luminous flux of the light source module 148 is the lowest when the base side of the light sources 10 has a regular triangular shape. Also, in the light source module 148 according to an aspect of the present disclosure, if the apex angle becomes smaller or greater, the luminous flux is increased, and when the luminous flux in case of the apex angle of 60° is 100%, the luminous flux in case of an apex angle of 165° is 105.4% which is the highest.

A horizontal axis of FIG. 8 illustrates an angle of an apex angle, and a vertical axis of FIG. 8 illustrates a beam angle per apex angle. Referring to FIG. 8, a x-axis beam angle and a y-axis beam angle of the light source module 148 are equally 145° when the apex angle is 60° and the base side of the light sources 10 has a regular triangular shape. Also, if the apex angle of the light source module 148 according to the present disclosure becomes greater, the x-axis beam angle becomes narrow and the y-axis beam angle becomes wide.

In the light source module 148 according to an aspect of the present disclosure as above, if the apex angle except for two base angles having the same angle on the base side of the light sources 10 having a triangular shape becomes greater or smaller than the base angle, light efficiency is improved. If the apex angle becomes greater, a x-axis beam angle becomes narrow and y-axis beam angle becomes wide.

Figure 9:
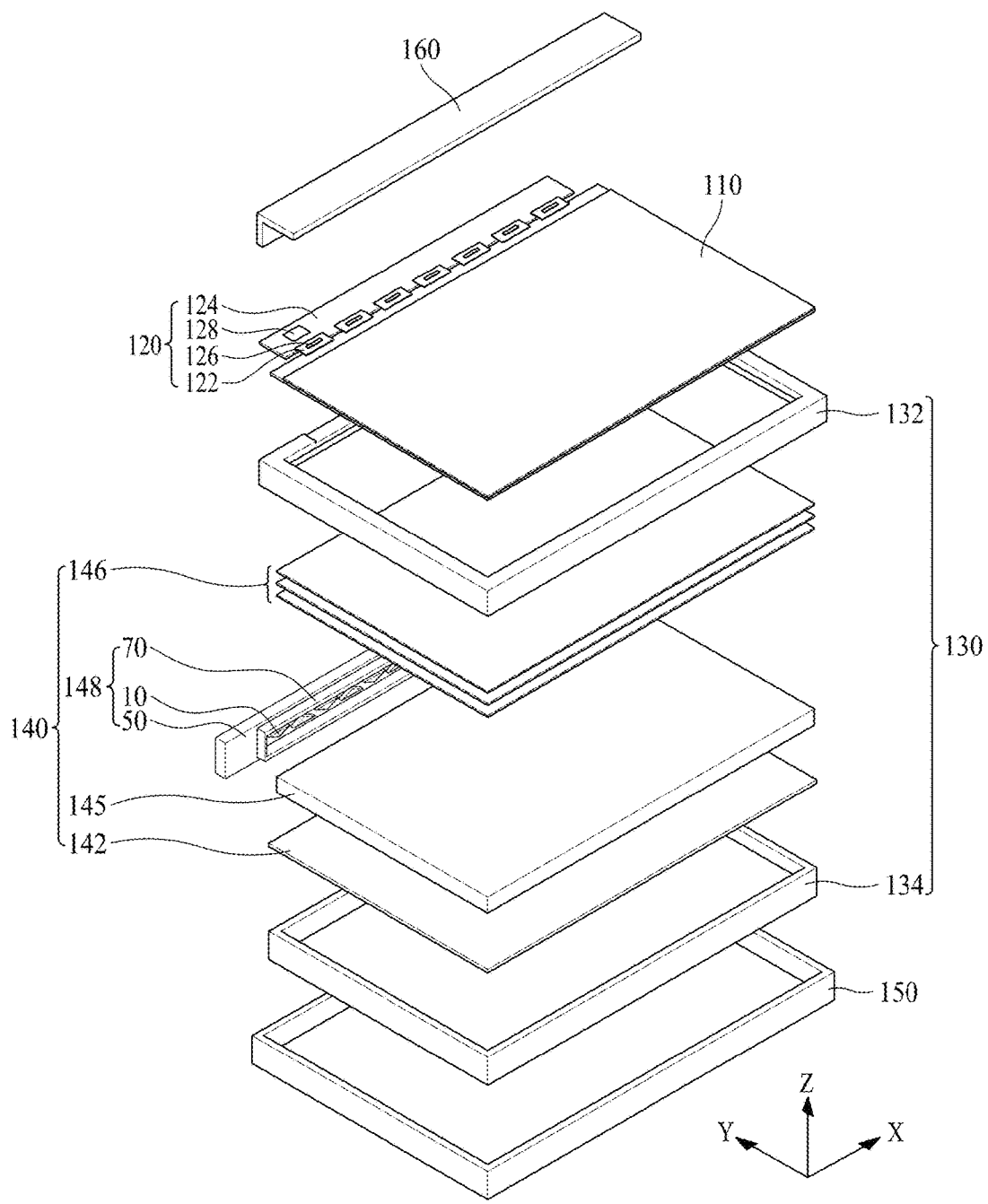
FIG. 9 is an exploded perspective view illustrating a liquid crystal display device according to another aspect of the present disclosure.
Figure 10:
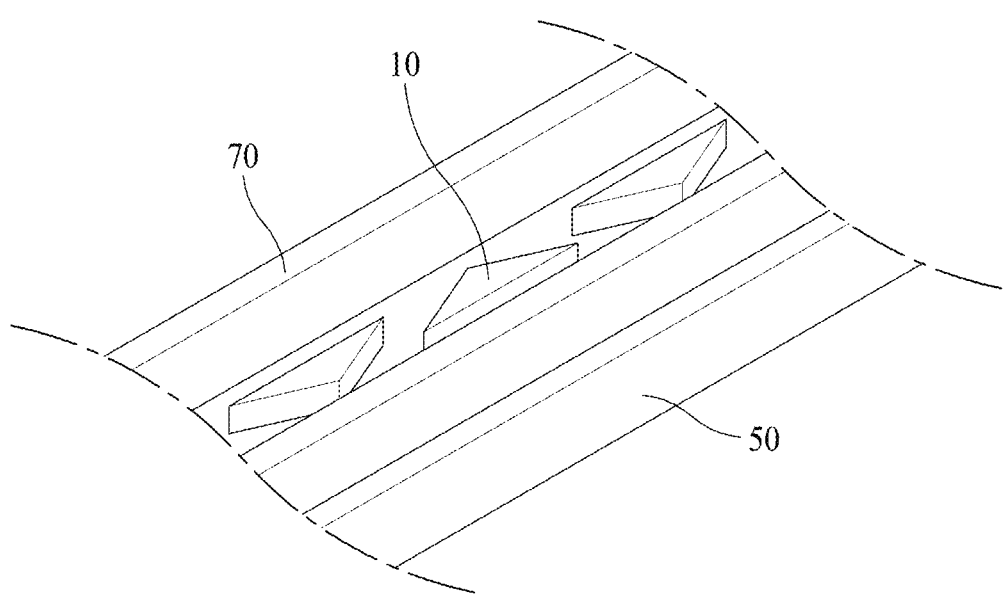
FIG. 10 is a perspective view illustrating a light source module according to another aspect of the present disclosure.

FIG. 9 is an exploded perspective view illustrating a liquid crystal display device according to another aspect of the present disclosure, and FIG. 10 is a perspective view illustrating a light source module according to another aspect of the present disclosure. The liquid crystal display device 100 according to another aspect of the present disclosure has an edge type structure in which light sources 10 are arranged at one side of the light guide plate 145, and comprises a liquid crystal panel 110, a panel driver 120, a panel support portion 130, a backlight unit 140, a lower case 150, and an upper case 160. This liquid crystal display device is the same as the direct type liquid crystal display device 100 shown in FIG. 2 except for a light source housing 134, a light guide plate 145 of the backlight unit 140 and the light source module 148. Therefore, the same reference numerals are given to the same elements, and repeated description of the repeated portion will be omitted.

Referring to FIGS. 9 and 10, the light source housing 134 according to another aspect of the present disclosure receives the backlight unit 140 and also supports the guide frame 132. Also, the light source housing 134 according to another aspect of the present disclosure emits heat generated from the light sources 10 to the outside. Therefore, the light source housing 134 according to another aspect of the present disclosure is made of a material that may radiate heat, and for example, may be made of, but not limited to, aluminum material.

The light guide plate 145 is formed in the form of a flat panel (or wedge) to have a light incident surface provided at a first side, and forwards light incident from the light source module 148 through the light incident surface to the liquid crystal panel 110.

The light source module 148 is arranged to face the first side of the light guide plate 145, and irradiates light to the light incident surface provided at one side of the light guide plate 145. The light source module 148 according to another aspect includes a plurality of light sources 10 packaged in a printed circuit board 50, emitting light through a driving signal of a light source portion supplied from a backlight driver (not shown), an encapsulation film 20 surrounding each of the light sources 10, and an optical member 70 surrounding the plurality of light sources 10.

The light sources 10 are made of a chip-scale package and directly packaged in the printed circuit board 50. Therefore, in the present disclosure, a packaging process of the light sources 10 is not required. The light sources 10 according to another aspect of the present disclosure emit first colored light in accordance with a light source driving signal. For example, the light sources 10 may be blue light sources 10 for emitting blue light. Also, a lateral chip structure, a flip chip structure, a vertical chip structure or like may be applied to the light sources 10.

The light sources 10 according to another aspect of the present disclosure have a triangular prism shape. The light sources 10 according to another aspect of the present disclosure may have a base side of a triangular shape with two apexes of the same angle. As the apex angle except two base angles having the same angle on the base side of the light sources 10 having a triangular shape becomes greater or smaller than the base angle, light efficiency is improved. If the apex angle becomes greater, a x-axis beam angle becomes narrow and y-axis beam angle becomes wide.

The plurality of light sources according to another aspect of the present disclosure are arranged in the printed circuit board 50 such that triangular shapes of the base sides of the light sources adjacent to each other cross each other. Therefore, the light sources 10 according to another aspect may be applied to the edge type backlight unit 140. Also, the light sources 10 have a triangular prism shape, total reflection is less generated, thereby emission efficiency is increased, and power consumption and lifespan of the light source module 148 and the backlight unit 140 including the same and the liquid crystal display device 100 may be improved.

The optical member 70 is arranged on the printed circuit board 50. In more detail, the optical member 70 is arranged between the printed circuit board 50 and the light incident surface of the guide plate 145. The optical member 70 according to another aspect of the present disclosure uniformly maintains an optical gap between the light guide plate 145 and the light sources 10. The optical member 70 has a frame type surrounding the plurality of light sources 10. The optical member 70 according to another aspect of the present disclosure surrounds the plurality of light sources 10, thereby the light emitted from the light sources 10 may be prevented from entering the area other than the light incident surface to minimize light loss.

Figure 11A:
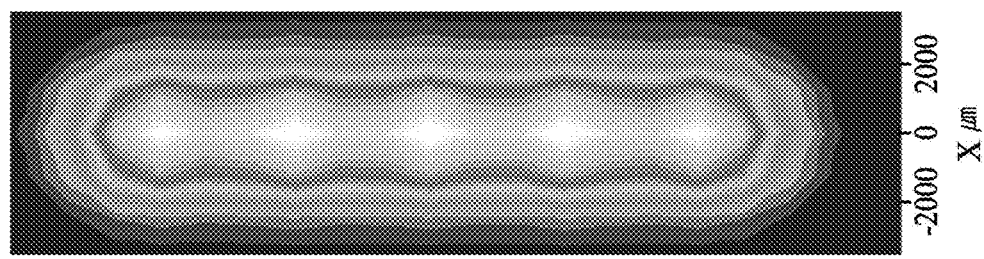
FIGS. 11A and 11B respectively illustrate luminance of the related art light source module and luminance of a light source module according to another aspect of the present disclosure.
Figure 11B:
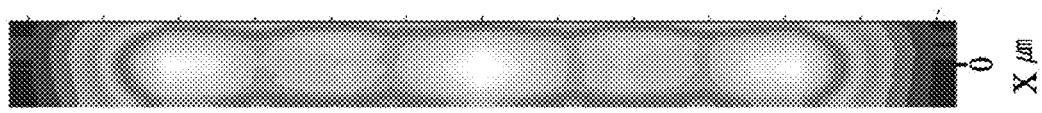

FIGS. 11A and 11B respectively illustrate luminance of the related art light source module and luminance of a light source module according to another aspect of the present disclosure.

FIG. 11A illustrates luminance when the light sources 10 and the encapsulation film 20 have a rectangular shaped upper surface in the light source module 148 according to the related art. It is generally noted that high luminance can be achieved with bright color. FIG. 11B illustrates luminance when the light sources 10 and the encapsulation film 20 have a triangular shaped upper surface in the light source module 148 according to the present disclosure. Referring to FIGS. 11*a* and 11*b*, luminance of the light source module 148 according to the present disclosure shown in FIG. 11B is higher than that of the light source module 148 according to the related art shown in FIG. 11A. Also, when luminance of the light source module 148 according to the related art shown in FIG. 11A is 100%, luminance of the light source module 148 according to the present disclosure shown in FIG. 11B is 117.1% improved as much as 17.1%.

The light source module 148 according to another aspect of the present disclosure has improved luminance and light incident efficiency as compared with the light source module 148 according to the related art, thereby quality of external appearance of the light source module may be improved.

According to the present disclosure as described above, following advantages may be obtained.

Since the light source module according to one aspect of the present disclosure includes the light sources and the encapsulation film of a triangular prism shape, total reflection may be reduced, thereby emission efficiency may be increased and power consumption and lifespan of the backlight unit including the light source module and the liquid crystal display device may be improved.

Also, as the under fill having low electrical conductivity, excellent heat conductivity and high reflectivity is provided below the light sources, the light source module according to one aspect of the present disclosure has high efficiency and high heat dissipation characteristics.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light source module comprising:
a printed circuit board;
a plurality of light sources packaged in the printed circuit board; and
an encapsulation film surrounding each of the plurality of light sources and having a same shape as the plurality of light sources,
wherein the light sources have a triangular prism shape.

2. The light source module of claim 1, wherein the encapsulation film has an upper surface of a triangular shape and a side of a triangular prism shape.

3. The light source module of claim 1, further comprising a phosphor material in the encapsulation film.

4. The light source module of claim 1, wherein the light sources have a base side of two apexes with the same angle.

5. The light source module of claim 1, further comprising an under fill between the printed circuit board and the plurality of light sources.

6. The light source module of claim 5, wherein the under fill includes a material having a low electrical conductivity and a high heat conductivity.

7. The light source module of claim 6, wherein the under fill is formed of h-BN or TiO2.

8. A backlight unit comprising:
a light guide plate having a light incident portion;
a light source module arranged to face the light incident portion and including a printed circuit board, a plurality of light sources packaged in the printed circuit board, and an encapsulation film surrounding each of the plurality of light sources and having a same shape as the plurality of light sources, wherein the light sources have a triangular prism shape; and
a reflective member arranged below the light guide plate,
wherein the plurality of light sources has triangular shapes and base sides of the triangular shapes are arranged to cross each other.

9. A display device including a light source module, comprising:
a printed circuit board;
a plurality of light sources packaged in the printed circuit board; and
an encapsulation film encapsulating each of the plurality of light sources and having a same shape as the plurality of light sources,
wherein the plurality of light sources emit light and have a shape minimizing the number of a total reflection of the emitted light inside the plurality of light sources and have a center matching that of the encapsulation film.

10. The display device of claim 9, wherein the encapsulation film has an upper surface of a triangular shape and a side of a triangular prism shape.

11. The display device of claim 9, further comprising a phosphor material in the encapsulation.

12. The display device of claim 9, wherein the plurality of light sources have a base side of two apexes with the same angle.

13. The display device of claim 9, further comprising an under fill between the printed circuit board and the plurality of light sources.

14. The display device of claim 13, wherein the under fill includes a material having a low electrical conductivity and a high heat conductivity.

15. The display device of claim 14, wherein the under fill is formed of h-BN or TiO2.

16. The display device of claim 13, further comprising first and second pad portions between the under fill.

17. The display device of claim 16, wherein the first and second pad portions are positive and negative electrodes, respectively.

18. The display device of claim 16, wherein the first and second pad portions are bonded to the printed circuit board with a solder material.

19. The display device of claim 9, further comprising a light guide plate having a light incident portion, wherein the light sources have a triangular prism shape having base sides arranged to cross each other.

20. The display device of claim 19, further comprising a reflective member arranged under the light guide plate.

* * * * *